(12) United States Patent
King et al.

(10) Patent No.: US 9,284,643 B2
(45) Date of Patent: Mar. 15, 2016

(54) SEMI-CONTINUOUS VAPOR DEPOSITION PROCESS FOR THE MANUFACTURE OF COATED PARTICLES

(75) Inventors: David M. King, Longmont, CO (US); Alan W. Weimer, Niwot, CO (US); Paul Lichty, Westminster, CO (US)

(73) Assignee: Pneumaticoat Technologies LLC, Westminster, CO (US)

( * ) Notice: Subject to any disclaimer, the term of this patent is extended or adjusted under 35 U.S.C. 154(b) by 543 days.

(21) Appl. No.: 13/069,452

(22) Filed: Mar. 23, 2011

(65) Prior Publication Data

US 2011/0236575 A1 Sep. 29, 2011

Related U.S. Application Data

(60) Provisional application No. 61/316,410, filed on Mar. 23, 2010.

(51) Int. Cl.
| | |
|---|---|
| *C23C 16/00* | (2006.01) |
| *C23C 16/44* | (2006.01) |
| *C04B 41/00* | (2006.01) |
| *C04B 41/45* | (2006.01) |
| *C04B 41/81* | (2006.01) |
| *C23C 16/40* | (2006.01) |
| *C23C 16/455* | (2006.01) |
| *C23C 16/442* | (2006.01) |

(52) U.S. Cl.
CPC ........... *C23C 16/4417* (2013.01); *C04B 41/009* (2013.01); *C04B 41/4584* (2013.01); *C04B 41/81* (2013.01); *C23C 16/402* (2013.01); *C23C 16/403* (2013.01); *C23C 16/405* (2013.01); *C23C 16/407* (2013.01); *C23C 16/442* (2013.01); *C23C 16/45525* (2013.01); *C23C 16/45555* (2013.01)

(58) Field of Classification Search
CPC ....... C23C 16/442; C23C 16/4417; B01J 8/00
USPC ......................................................... 118/716
See application file for complete search history.

(56) References Cited

U.S. PATENT DOCUMENTS

| | | | | |
|---|---|---|---|---|
| RE31,473 | E * | 12/1983 | Kilby et al. | .......................... 425/6 |
| 4,632,849 | A * | 12/1986 | Ogawa et al. | .......... 427/255.394 |
| 4,715,316 | A * | 12/1987 | Broomfield et al. | ........... 118/716 |
| 6,274,196 | B1 * | 8/2001 | Amano et al. | .......... 427/255.394 |
| 6,328,804 | B1 * | 12/2001 | Murzin et al. | ................. 118/715 |
| 6,428,861 | B2 * | 8/2002 | France et al. | .................. 427/488 |

(Continued)

FOREIGN PATENT DOCUMENTS

JP H11019498 A * 1/1999

*Primary Examiner* — Gordon R Baldwin
*Assistant Examiner* — Charlee Bennett
(74) *Attorney, Agent, or Firm* — Foley & Lardner LLP; Sunit Talapatra

(57) ABSTRACT

A reactor for conducting vapor phase deposition process is disclosed. The reactor includes a reactive precursor reservoir beneath a powder reservoir and separated from it by valve means. A reactive precursor is charged into the reactive precursor reservoir and a powder is charged into the powder reservoir. The pressures are adjusted so that the pressure in the reactive precursor reservoir is higher than that of the powder reservoir. The valve means is opened, and the vapor phase reactant fluidized the powder and coats its surface. The powder falls into the reactive precursor reservoir. The apparatus permits vapor phase deposition processes to be performed semi-continuously.

7 Claims, 6 Drawing Sheets

(56) References Cited

U.S. PATENT DOCUMENTS

| | | |
|---|---|---|
| 6,613,383 B1 | 9/2003 | George |
| 6,689,191 B2 | 2/2004 | Dunmead |
| 6,713,177 B2 | 3/2004 | George |
| 6,773,813 B2 * | 8/2004 | Klinedinst et al. ............ 428/403 |
| 7,081,267 B2 | 7/2006 | Yadav |
| 7,211,236 B2 | 5/2007 | Stark |
| 7,476,378 B2 | 1/2009 | Subramanian |
| 7,713,907 B2 | 5/2010 | Elam |
| 7,758,928 B2 | 7/2010 | Bunce |
| 7,833,437 B2 | 11/2010 | Fan |
| 2004/0224087 A1 | 11/2004 | Weimer |
| 2008/0130399 A1 * | 6/2008 | Littman et al. ................ 366/132 |
| 2008/0138674 A1 * | 6/2008 | Pez et al. ........................ 429/17 |
| 2008/0179433 A1 | 7/2008 | Pfeffer |
| 2009/0155590 A1 | 6/2009 | Kelder |
| 2010/0092841 A1 | 4/2010 | Lopez |
| 2010/0326322 A1 | 12/2010 | King |

* cited by examiner

FIGURE 2A
FIGURE 2B
FIGURE 2C
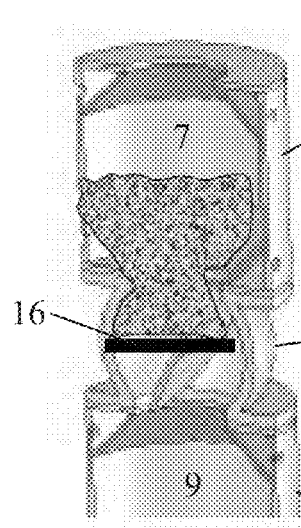
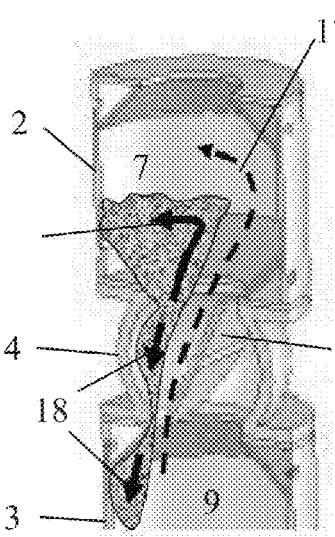
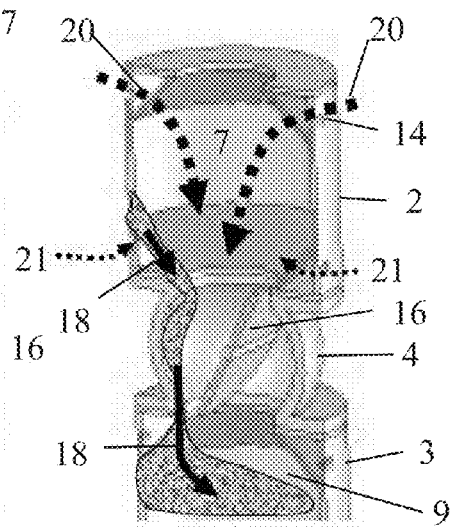

I II III IV V VI VII VIII

SEMI-CONTINUOUS VAPOR DEPOSITION PROCESS FOR THE MANUFACTURE OF COATED PARTICLES

This application claims priority from U.S. Provisional Patent Application No. 61/316,410, filed 23 Mar. 2010.

The incorporation of particles from millimeter-scale down to nanometers in size is ubiquitous in end-use products produced in industrial-scale quantities. A significant percentage of the particles used across all industries require that the surfaces be coated with a shell, layer, film, or other coating, ranging from sub-nanometer to hundreds of micrometers in thickness. For a variety of reasons, each sector or industry has determined that the incorporation of coated particles into the end-use product provides enough value-add in the performance of the product that the cost associated with each coating process is justified. Vapor deposition techniques are sometimes used to deposit the coatings. Examples of vapor deposition techniques can include chemical vapor deposition (CVD), physical vapor deposition (PVD), atomic layer deposition (ALD), molecular layer deposition (MLD), vapor phase epitaxy (VPE), atomic layer chemical vapor deposition (ALCVD), ion implantation or similar techniques. In each of these, coatings are formed by exposing the powder to reactive precursors, which react either in the vapor phase (in the case of CVD, for example) or at the surface of the powder particles (as in ALD and MLD). These processes can be augmented by the incorporation of plasma, pulsed or non-pulsed lasers, RF energy, and electrical arc or similar discharge techniques.

Vapor deposition processes are usually operated batchwise in reaction vessels such as fluidized bed reactors, rotary reactors and V-blenders, amongst others. Batch processes have significant inefficiencies when operated at large scale, for several reasons. The reactor throughput is a function of the total particle mass or volume loaded into a certain sized vessel for a given process, the total process time (up-time), and the total time between processes (down-time) to load, unload, clean, prepare, etc. Batch processes incur large down-times because at the end of each batch the finished product must be removed from the reaction equipment and fresh starting materials must be charged to the equipment before the subsequent batch can be produced. Equipment failures and maintenance add to this downtime. Process equipment tends to be very large and expensive in batch processes. The need to operate these processes under vacuum adds greatly to equipment costs, especially as equipment size increases. Because of this, equipment costs for batch processes tend to increase faster than operating capacity. Another problem that occurs as the process equipment becomes larger is that it becomes more difficult to maintain uniform reaction conditions throughout the vessel. For example, temperatures can vary considerably within a large reaction vessel. It is also difficult to adequately fluidize a large mass of particles, specifically nanoparticles. Issues such as these can lead to inconsistencies and defects in the coated product.

In vapor deposition processes such as ALD and MLD, the particles are contacted with two or more different reactants in a sequential manner. This represents yet another problem for a batch operation. For a traditional batch process, all cycles are performed sequentially in a single reaction vessel. The batch particle ALD process inherently incurs additional down-time due to more frequent periodic cleaning requirements, and the reaction vessels cannot be used for multiple film types when cross-contamination could be problematic. In addition, the two sequential self-limiting reactions may occur at different temperatures, requiring heating or cooling of the reactor between cycle steps in order to accommodate each step. The throughput for a batch process can be increased either by building larger reaction vessels and/or operating identical reaction vessels in parallel. The capital cost-effective tendency to counteract this down-time from a throughput perspective is to build a larger reaction vessel. With larger vessels, localized process conditions, including internal bed heating, pressure gradients, mechanical agitation to break up nanoparticle aggregates, and diffusion limitations amongst others, become more difficult to control. There is a practical maximum reaction vessel size when performing ALD processes on fine and ultra-fine particles, which limits the annual throughput for a single batch reactor operating continually, where the time duration of the process producing a given amount of coated materials equals the up-time plus downtime. There is a practical maximum allowable capital expense to fabricate a particle ALD production facility, which effectively limits the number of batch reactors that operate identical processes in parallel. With these constraints, there are practical throughput limitations that prohibit the integration of some particle ALD processes at the industrial scale. There is a need to develop a high throughput semi-continuous or continuous-flow ALD process in order to meet industrial scale demands.

In vapor deposition processes such as CVD, the particles can be contacted with two or more different reactants concurrently, or by one or more reactants that do not exhibit the self-limiting behavior characteristic of ALD and MLD processes. For a traditional batch CVD process, the primary methods of controlling reactions are limited to reactant exposure time and operating conditions such as process temperatures and pressures. The batch particle CVD process inherently has limited opportunity to prevent unwanted gas-phase side reactions. There is also a practical maximum reaction vessel size when performing batch particle CVD processes as small variations in the process conditions can lead to large variations in product quality throughout the batch of particles produced. There is a need to develop a high throughput semi-batch or semi-continuous particle CVD process in order to meet industrial scale demands without sacrificing product quality.

This invention is a reactor for performing vapor phase deposition on a powder, comprising 1. a powder reservoir;
2. a reactive precursor reservoir positioned below the powder reservoir;
3. valve means interposed between the powder reservoir and the reactive precursor reservoir, said valve means operable between an open and a closed position such that the powder reservoir is isolated from said reactive precursor reservoir when said valve means is in the closed position but, when the valve means is in the open position, the powder reservoir is in communication with the reactive precursor reservoir such that a reactive precursor contained within the reactive precursor reservoir can flow into the powder reservoir and a powder contained within said powder reservoir can fall into the reactive precursor reservoir.

The reactor of the invention typically further comprises at least one of (a) a powder inlet for charging powder to the powder reservoir; (b) one or more inlet ports in fluid communication with the reactive precursor reservoir and a reactive precursor dosing system; (c) one or more inlet ports into the powder reservoir and/or the reactive precursors in fluid communication with dosing system for such purge or sweep gas, (d) one or more outlet ports in fluid communication with the powder reservoir, the reactive precursor reservoir or both may be in fluid communication with removal means for removing fluids from the powder reservoir and/or reactive precursor reservoir and/or producing a vacuum therein, (e) at least one analytical devices for detecting the presence and/or concentration of at least one reactive precursor, sweep gas, purge gases and/or reaction product, and/or to measure the presence and/or extent of coatings on the particle surfaces and (f) a heating and/or cooling devices to provide temperature control to the powder reservoir, the reactive precursor reservoir, or both. Computerized control and operating devices may be used to operate one or more valves, pumps, heating and/or cooling devices, or other devices. A porous knife valve or similar device may be present between the powder reservoir and the reactive precursor reservoir. When closed, this porous knife value or similar device can act as a support for the powder bed, and permit the reactor to function as a conventional fluidized bed reactor.

Certain embodiments of this invention are an assembly of at least a first and a second reactor of the invention, and further including transport means for removing a coated powder from the reactive precursor reservoir of the first reactor and delivering the coated powder to the powder reservoir of the second reactor. More generally, certain embodiments of the invention are an assembly of at least two reactors as just described, arranged in a sequence, and further including transport means from removing a coated powder from the reactive precursor reservoir of each reactor except the last reactor in the sequence and delivering the coated powder to the powder reservoir of the next reactor in the sequence.

The invention is also a vapor phase deposition process for applying a coating to the surface of a powder, comprising A. charging a powder to a powder reservoir;

B. charging at least one reactive precursor to a reactive precursor reservoir positioned below the powder reservoir, and bringing the reactive precursor reservoir containing the reactive precursor(s) to conditions such that the reactive precursor(s) are in the vapor state and wherein the pressure in the reactive precursor reservoir is higher than the pressure in the powder reservoir;

C. after steps A and B, discharging the reactive precursor vapor from the reactive precursor reservoir into the powder reservoir such that (1) the powder particles in the powder reservoir are contacted by the reactive precursor vapor and become at least partially fluidized thereby, (2) the reactive precursor(s) or reaction product thereof deposit at the surfaces of the powder particles and (3) the powder falls from the powder reservoir into the reactive precursor reservoir; and then D. removing the powder from the reactive precursor reservoir.

The process of the invention is of particular applicability in processes in which the coating process includes a series of N sequential steps wherein in each step from 1 to N the surface of the powder is exposed to one or more vapor phase precursor materials, which vapor phase precursor materials or reaction product thereof deposit in each step at the surface of the particles to form a coating thereon, wherein N is at least 2, and further wherein at least one of said N sequential steps is performed according to steps A-D as just described. In a preferred process, at least two consecutive steps of said N sequential steps are performed by conducting steps A-D as just described in a first reactor with at least one first reactive precursor, transferring the coated powder to a second reactor and then repeating steps A-D in a second reactor with at least one second reactive precursor which may be the same or different than the first reactive precursor.

In certain embodiments of the process each step n of said N sequential steps is performed by A. charging a powder from step n−1, or a starting powder in the case where n=1, to an nth powder reservoir;

B. charging at least one reactive precursor to an nth reactive precursor reservoir positioned below the nth powder reservoir, and bringing the nth reactive precursor reservoir containing the reactive precursor to conditions such that the reactive precursor(s) in the vapor state and wherein the pressure in the nth reactive precursor reservoir is higher than the pressure in the nth powder reservoir; then C. discharging the reactive precursor(s) from the nth reactive precursor reservoir into the nth powder reservoir such that (1) the powder particles in the nth powder reservoir are contacted by the reactive precursor vapor and become at least partially fluidized thereby, (2) the reactive precursor(s) or a reaction product thereof deposits at the surfaces of the powder particles and (3) the powder falls from the nth powder reservoir into the nth reactive precursor reservoir; then D. removing the powder from the nth reactive precursor reservoir and, when n<N, transferring the powder to an (n+1) th powder reservoir.

In certain embodiments, one or more layers of a coating are applied to the powder, wherein at least one of such layers is formed in a reaction cycle of X steps in which the powder is exposed sequentially to X vapor phase reagents in X reactors, where X is at least 2, and each step x of said X steps in each reaction cycle is performed by A. charging a powder from step x−1, or a starting powder or a coated powder from a previous reaction cycle when x=1, into an xth powder reservoir of an xth reactor;

B. charging an xth reactive precursor to an xth reactive precursor reservoir positioned below the xth powder reservoir, and bringing the xth reactive precursor reservoir containing the xth reactive precursor to conditions such that the xth reactive precursor is in the vapor state and wherein the pressure in the xth reactive precursor reservoir is higher than the pressure in the xth powder reservoir;

C. after steps A and B, discharging the xth reactive precursor from the xth reactive precursor reservoir into the xth powder reservoir such that (1) the powder particles in the xth powder reservoir are contacted by the xth reactive precursor vapor and become fluidized thereby, (2) the xth reactive precursor or a reaction product thereof deposits at the surfaces of the powder particles and (3) the powder then falls from the xth powder reservoir into the xth reactive precursor reservoir; then D. removing the powder from the xth reactive precursor reservoir and, when x<X, transferring the powder to an (x+1) th powder reservoir.

In this embodiment, additional layers of the same coating can be provided by (1) passing the powder obtained in the Xth reactive precursor reservoir back through the series of X reactors one or more additional times, (2) passing the powder through one or more additional sets of X reactors.

This invention provides for a simplified apparatus in which vapor deposition processes can be performed in a semi-continuous manner. This apparatus permits a single batch process to be separated into a series of semi-continuous steps, each of which can be conducted in another unit of the apparatus, or in some cases, the same unit. Thus, any number of reactors as described herein can be arranged in series to perform any desired number of coating operations. The apparatus is scalable to accommodate any needed production capacity, or to accommodate any number of sequential coating steps. The apparatus is also easily adaptable to producing coatings of various thicknesses onto the starting particles, simply by operating more or fewer of the individual reactors. Similarly, production rates can be varied easily by operating fewer or more of the reactors in parallel, or by modulating the volume of particles charged into the first unit of the apparatus. A loss-in-weight hopper, or similar commercial device, can be used to precisely control the volume of particles charged into the first unit, and process controls can be implemented to modulate the amount of reactant charged into the unit. With these controls, the throughput of individual reactors in the sequence, and net production volume of the entire apparatus can be precisely tuned to employ lean manufacturing techniques in the production line.

Using the apparatus and processes of the invention, throughput of coated particles can be increased by factor of two to more than 2000 per unit of reactor volume, compared to conventional batch reactors, depending on the type of vapor deposition process in use. This enhanced throughput can allow more precise control of the process. Thus, this semi-continuous process can allow higher quality products to be produced for similar or lower capital cost, while reducing variable operating costs due to higher utilization of precursor materials.

The apparatus and process of this invention can be applied easily to ALD and MLD, which are sequential processes whereby layers are deposited one atom/molecule/monolayer at a time under proper growth conditions. At least two sequential exposures of reactants are required to complete one cycle of an ALD or MLD process, where each of the individual reactants do not react with themselves (i.e. a self-limiting process). Total coating thickness is determined by the number of cycles when all other process conditions are held constant.

One example where a semi-continuous coated particle manufacturing process is desirable is a facility that utilizes particle ALD to produce fine or ultra-fine passivated titanium dioxide particles used as pigments in paints, plastics, paper, etc. Another example is a facility that utilizes particle ALD to produce coated fine or ultra-fine particles for cathodes, anodes, dielectrics, metals, polymers, semiconductors and other ceramics for integration into power systems devices including, but not limited to, batteries, capacitors, varistors, thyristors, inverters, transistors, light emitting diodes and phosphors, photovoltaic, and thermoelectric devices. Particle ALD produced powders for the pigment and power systems industries can significantly improve the performance of the end-use products, which can be cost competitive if produced at high annual throughputs.

In processes such as CVD, in which the coatings are applied by exposing the particles to all reagents at once, the invention offers benefits such as better process control, which can lead to forming higher quality coatings and coatings of more consistent quality. Due to the generally smaller reactor volumes, more uniform temperature conditions can be maintained within the reactor, and more uniform distribution of the reagents among the particles can be attained. In addition, this process allows one to sequentially expose the particles to smaller quantities of reagents, thereby growing a CVD-deposited film to a certain thickness by building up thinner coating layers onto the particle surface.

FIG. 2 is a partial front sectional view illustrating the operation of an embodiment of the reactor of the invention.

Figure 1:
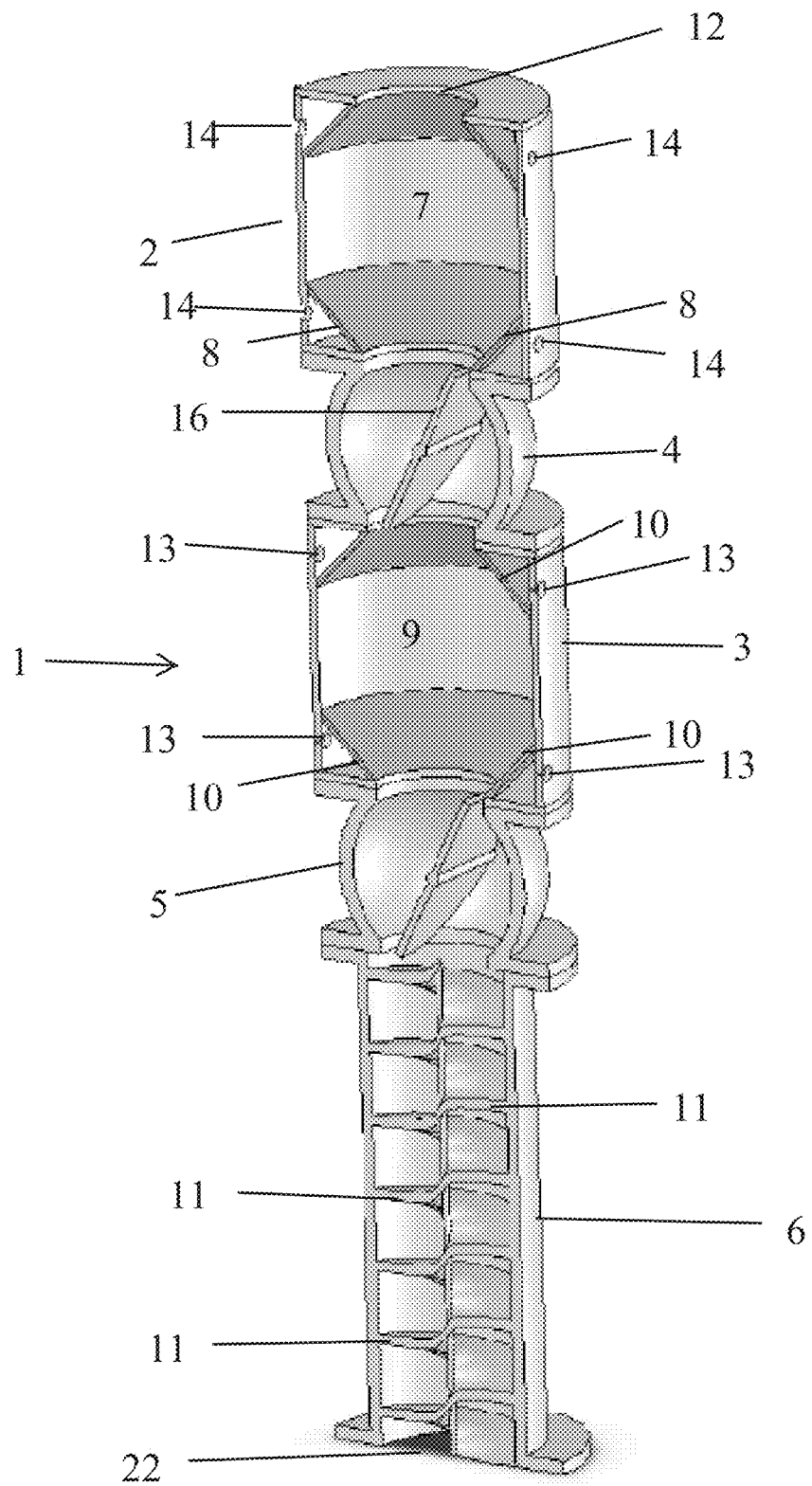
FIG. 1 is a front sectional view of an embodiment of a reactor of the invention.

In FIG. 1, reactor 1 includes powder reservoir 2 and reactive precursor reservoir 3. Powder reservoir 2 includes chamber 7, one or more optional but preferred ports 14 through which a vacuum can be pulled on chamber 7 or a purge, flushing or additional fluidizing gas can be introduced into chamber 7, powder inlet 12, through which starting powder or partially coated powder from an upstream step in a coating process is delivered into powder reservoir 7. Powder inlet 12 preferably can be sealed after introduction of a powder to allow pressure conditions to be controlled within chamber 7. In the embodiment shown, flanges 8 narrow the width of chamber 7 near its bottom, to provide a constricted flow path for reactive precursor(s) entering chamber 7 from valve means 4 and to produce higher gas velocities (and therefore better fluidization of the powder) when valve means 4 is opened to permit the reactive precursor to enter chamber 7.

Reactive precursor reservoir 3 includes chamber 9 and one or more ports 13. Ports 13 allow the reactive precursor(s) to be introduced into chamber 9, allow a vacuum to be pulled into chamber 9, allow a pressurizing gas, sweep gas or a purge gas to be introduced into chamber 9, or perform other functions. Flanges 10 are present in the embodiment shown, but are optional.

Valve means 4 is interposed between powder reservoir 2 and reactive precursor reservoir 3 and is in fluid communication with both of them. In the embodiment shown, valve means 4 includes butterfly valve 16, which can move from an open position (as shown), in which powder reservoir 2 and reactive precursor reservoir 3 are in fluid communication, or into a closed position. Although depicted in FIG. 1 as a butterfly valve, valve means 4 can be any type of apparatus which operable between an open and a closed position. When closed, valve means 4 isolates powder reservoir 2 from reactive precursor reservoir 3. When open, powder can fall from powder reservoir 2 into reactive precursor reservoir 3, and the reactive precursor(s) in reactive precursor reservoir 3 can flow into powder reservoir 2. Ball valves, globe valves, gate valves, knife gate valves, star valves and other types of valves which are adapted to operate at the operating pressures are all suitable. A porous gate valve may be used. An advantage of using a porous gate value is that such a valve permits hybrid processes to be performed, in which during a portion of the time each chamber is operated identically to how a batch fluidized bed reactor is operated, and during a later time, the porous gate valve is pulled back to permit the the process to proceed in semi-continuous fashion once again.

Lower valve 5 resides below reactive precursor reservoir 3 and is in fluid communication therewith. Lower valve 5 is operable between an open and a closed position such the contents of reactive precursor reservoir 3 cannot escape from cavity 9 when lower valve 5 is in a closed position, but can pass out of cavity 9 through lower valve 5 when lower valve 5 is in an open position.

Reactor 1 operates as follows:

Butterfly valve 16 is placed into its closed position. Valve means 5 is also brought to a closed position. The powder to be treated, which may be a starting powder or a partially coated powder from an upstream process, is charged to cavity 7 of powder reservoir 2 through powder inlet 12. Powder inlet 12 is closed. One or more reactive precursors are introduced through one or more of ports 13 into chamber 9 of reactive precursor reservoir 3. Conditions of temperature and pressure within chamber 9 are such that the reactive precursor(s) are maintained in the gas phase within chamber 9. If necessary, chamber 9 can be evacuated by pulling a vacuum on it, via one or more ports 13 or some other port (not shown), in order to reduce the pressure within chamber 9 prior to introducing the reactive precursor. Heating means (not shown) can be present to adjust the temperature to the needed value, if necessary.

The pressure in chamber 9 is adjusted not only to maintain the reactive precursor(s) in the form of a gas, but also such that the pressure in chamber 9 exceeds that in chamber 7 of powder reservoir 2. The pressure difference between chamber 9 and chamber 7 is such that when valve means 4 is opened to allow the reactive precursor(s) to flow into chamber 7, the reactive precursor(s) escapes into chamber 7 with enough force to at least partially fluidize the powder contained within chamber 7. The absolute values of those pressures are not critical, provided that the reactive precursor(s) are maintained in the gas phase and the pressures in chamber 7 is lower than that of chamber 9.

By "fluidize", it is meant that the particles are lifted and separated by a gas stream. This is accompanied by an expansion of the volume taken up by the mass of powder particles, due to the separation of particles from one another due to the lifting effect of the gas. By "partially" fluidized, it is meant that the fluidization is not accomplished entirely by the reactive precursor(s) entering into chamber 7 from chamber 9, but instead an additional source of fluidizing gas is provided to assist in the fluidization. Such additional source of fluidizing gas may be introduced into chamber 7, preferably at or near the bottom of the powder bed, via one or more gas jets, such as those described in United States Published Patent Application No. 2008-0179433. The additional fluidizing gas should be either (1) an inert gas which does not react with particles, the reactive precursor(s) or the reaction products of any reaction of the reactive precursor(s), or (2) an additional quantity of the reactive precursor(s). The addition of any such additional fluidizing gas should be performed such that the necessary pressures and temperatures are maintained in chamber 7 and chamber 9.

The temperature within chamber 7 is high enough that (1) the reactive precursor does not condense before it or its reaction product deposits onto the surface of the powder particles, (2) the reactive precursor can react as desired, typically (as in ALD and MLD) at the surface of the powder, and (3) reaction by-products, if any, are in the vapor phase. If necessary, a vacuum can be pulled within chamber 7 via one or more ports 14 or some other port (not shown) in order to reduce the pressure within chamber 7 prior to opening valve means 4.

When the powder is in place in powder reservoir, the reactive precursor(s) have been charged into reactive precursor reservoir 3 and the temperatures and pressures are adjusted within chambers 7 and 9 as described, valve means 4 is actuated to an open position. This permits the reactive precursor(s) contained in cavity 9 to flow past valve means 4 and into chamber 7 of powder reservoir 2. The flow of the reactive precursor(s) at least partially fluidizes the powder particles contained in chamber 7 and either the reactive precursor itself or a reaction product thereof deposits onto the surface of the powder particles. This is illustrated in FIGS. 2A-2C. If an additional fluidizing gas is used, it should be introduced prior to and/or simultaneously with the release of the reactive precursor(s) from chamber 0 into chamber 7.

In FIG. 2A, butterfly valve 16 is first in the closed position, separating chamber 7 from vapor phase reservoir 3. In FIG. 2B, butterfly valve 16 is moved to an open position, allowing the reactive precursor(s) held in vapor phase reservoir 3 to move upwardly into chamber 7 of powder reservoir 2. The movement of the reactive precursor is represented by arrows 17 and 19. As seen in FIG. 2B, at least a portion of the reactive precursor(s) flows through the powder and fluidizes it. Simultaneously, the powder begins to flow downwardly through valve means 4 and into reactive precursor reservoir 3, in the direction indicated by arrows 18. The reactive precursor(s), being a gas, will fill the entire combined volumes of chambers 7 and 9 and valve means 4, and come into contact with the surfaces of the polymer particles, where the reactive precursor(s) or a reaction product thereof deposits onto the particle surface. In FIG. 2C, an optional purge flow can be introduced into chamber 7 of powder reactor 2, in the general direction indicated by arrows 20 and/or by arrows 21, through ports 14 or similar inlet ports. This purge flow helps to complete the movement of the powder out of cavity 7 and into cavity 9. The direction of this powder flow is again indicated in FIG. 2C by arrows 18. At the conclusion of the process step, essentially all of the powder resides in cavity 9 of vapor phase reservoir 3.

Turning back to FIG. 1, the coated powder can be withdrawn from cavity 9 of vapor phase reservoir 3 by opening valve means 5 and allowing the coated powder to fall out of cavity 9. A purge gas can be introduced through one or more of ports 13 to assist in the removal of the powder. FIG. 1 shows optional purge zone 6, where further separation of the coated powder from the reactive precursor (plus any reaction by-products that may be present and/or any purge gas) can be performed. Purge zone 6 may include a cyclone or similar device for separating solid particles from a gas. Such a cyclone can include a pathway 11 through which the coated polymer particles can pass, while being disengaged from the gas. In the embodiment shown in FIG. 1, the coated powder is withdrawn from reactor via outlet 22.

An apparatus of the invention can include at least two reactors as generally described herein (such as that illustrated in FIG. 1) in series, with transport means interposed between consecutive reactors, through which the coated powder from one reactor is transferred to a next consecutive reactor. The transport means can be simply a conduit which establishes a path from cavity 9 of reactive precursor reservoir 3 of a first reactor to a chamber 7 of powder reservoir 2 of the next consecutive reactor. The powder outlet of one of the reactors may feed directly into the powder inlet of the next reactor in the sequence. By stacking the two reactors one atop the other, powder can simply fall out of the powder outlet of one reactor, and though the powder inlet and into the powder reservoir of the next one in the sequence.

Alternatively, or in addition, various types of pneumatic conveyors, mechanical conveyors, vibrating devices, gas delivery jets, sonic devices and the like can be used to transport the coated powder to the next consecutive reactor. Once the powder is in the next consecutive reactor, it can be contacted with one or more additional reactive precursors in the same manner already described.

Figure 3:
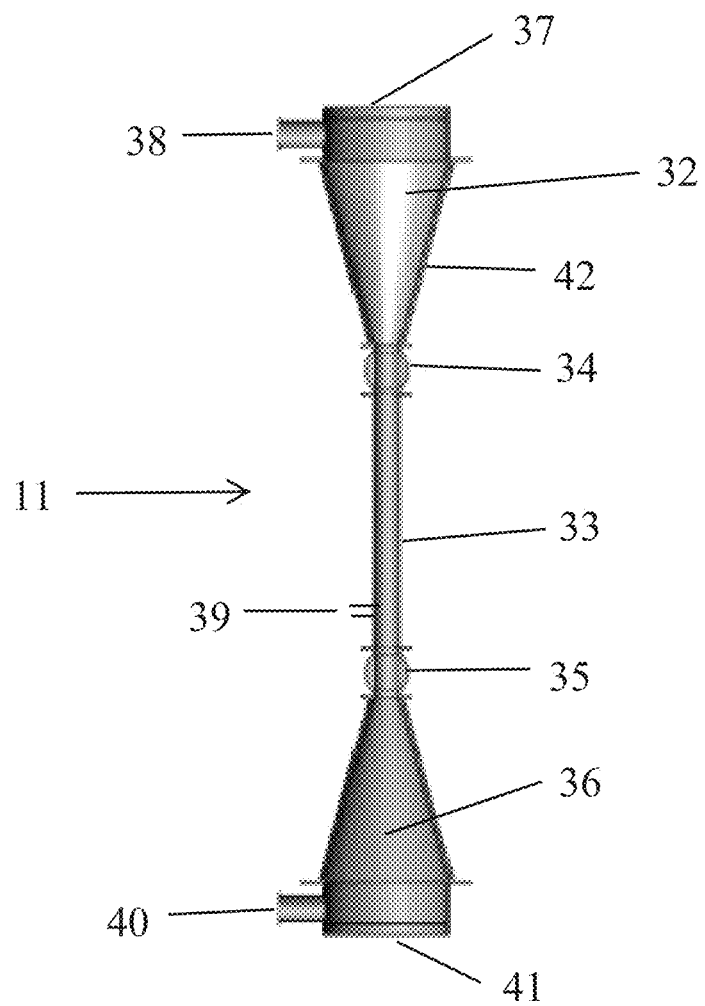
FIG. 3 is a front view of another embodiment of an apparatus of the invention.

FIG. 3 shows an alternative reactor design. Reactor 31 includes powder reservoir 32, reactive precursor reservoir 33 and purge zone 36, which is optional. Valve means 34 is interposed between powder reservoir 32 and vapor reactant reservoir 33, and operates in the same way as valve means 4 in FIG. 1. Valve means 35 is interposed between reactive precursor reservoir 33 and optional purge zone 36, and again operates the same way as valve means 5 of FIG. 1. Inlets 37, 38 and 39 perform the same functions as the corresponding apparatus in FIG. 1. Process gas can be withdrawn from outlet 40, and the treated powder is removed via outlet 41.

In FIG. 3, the cross-sectional area of reactive precursor reservoir 33 (taken in a horizontal plane) is significantly smaller than that of powder reservoir 2. The small cross-sectional area of reactive precursor reservoir is a preferred design, as this design reduces the cross-sectional area where the reactive precursor makes contact with the powder at the bottom of powder reservoir 32, thereby better fluidizing the powder bed and improving the contact of the reactive precursor with the powder particles. A similar effect can be obtained by interposing an area of restricted cross-section between reactive precursor reservoir 33 and powder reservoir 32. The narrowest sections of the reactor (in FIG. 3, this corresponds to reactive precursor reservoir 33) should be wide enough so that the powder does not neck in those narrow regions and block the movement of the powder.

In FIG. 3, walls 42 of powder reservoir 32 slant inwardly, gradually reducing the cross-sectional area of powder reservoir 32 towards the point where it meets valve means 34. This is again a preferred design, as it facilitates the transfer of the powder out of powder reservoir 32 and into vapor phase reservoir 33. Conical sections or inwardly slanting walls such as walls 42 can also serve to introduce an area of restricted cross-section between vapor phase reservoir 33 and powder reservoir 32.

Multiple reactors as shown in FIGS. 1 and 3 can be operated in series to conduct any number of coating steps. Thus, up to N reactors can be arranged in series to conduct a series of N sequential coating operations at the surface of powder particles. The number of reactors should be at least two and may be as great as N. If the number of reactors is less than N, then the process is conveniently operated by passing the powder through the series of reactors to partially coat it, and then recycling the powder back to the beginning or some intermediate reactor to complete the coating process.

The term "sequential" is used herein to mean only that the coating operations on a given sample of powder are conducted one after the other in time. The coating operations may be consecutive, i.e., one following immediately after the other. Alternatively, intervening steps can be performed between any two sequential coating operations in accordance with the invention, using different methods or differing apparatus, if desired.

In ALD and MLD processes, a layer of a coating material is formed by contacting the powder with a sequence of two or more different reactive precursors. The powder is contacted with a single reactive precursor, which does not react with itself, in each step of the sequence. The completion of a full sequence of reactants constitutes a reaction cycle, and applies one layer of the coating material. In such a process, thicker coatings are applied by repeating the reaction cycle, each time forming an additional coating layer, until the desired coating thickness is obtained. In vapor phase coating processes, it is generally preferable to use each reactor to apply only a single type of reactive precursor or coating to the particles. In this way, contamination of raw materials can be avoided, and with ALD and MLD the deposition of the reactants (or their reaction products) onto the interior walls of the reaction vessels can be minimized. In addition, different reaction conditions, especially temperature and/or pressure, might be beneficial in the different steps in the cycle. Therefore, if the number of reactive precursors to be applied in a single reaction cycle is X, a preferred way of applying each coating layer is to pass the powder sequentially through X reactors, each of which applies a single reactive precursor. To apply thicker coatings, the powder can either by recycled through the set of X reactors, or passed through one or more additional, like sets of X reactors.

More complex patterns of coating operations also can be performed according to the invention, through the appropriate configuration and organization of individual reactors.

Figure 6:
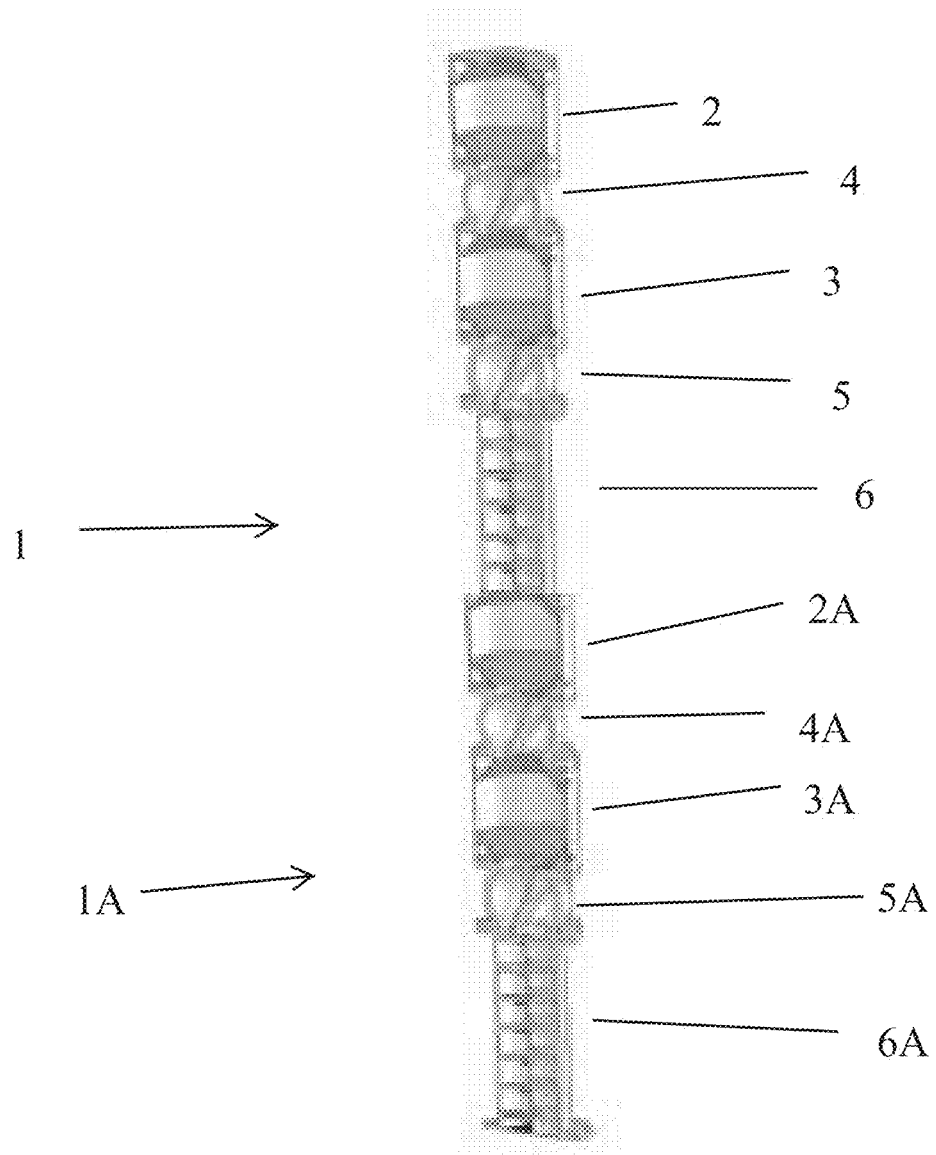
FIG. 6 is a front section view of another embodiment of a reactor of the invention.

FIG. 6 illustrates a simple arrangement of two reactors, in which particles from the first reactor are transferred to a second reactor by allowing them to fall under the force of gravity (which may be assisted by mechanical, ultrasonic or other means). In FIG. 6, a first reactor designated generally by reference numeral 1 is stacked above a second reactor designated generally by 1A. As shown, first reactor 1 and second reactor 1A are of the same general design as the reactor shown in FIG. 1. First reactor 1 includes, from top to bottom, powder reservoir 2, valve means 4, reactive precursor reservoir 3, valve means 5 and purge zone 6, which are designed and function generally as described with respect to FIG. 1. The bottom outlet of purge zone 6 communicates with the powder inlet of second reactor 1A, so that powder exiting purge zone 6 is transferred directly into powder reservoir 2A of second reactor 1A. Second reactor 1A includes, from top to bottom, powder reservoir 2A, valve means 4A, reactive precursor reservoir 3A, valve means 5A and purge zone 6A, which are designed and function generally in the manner described for the corresponding features in FIG. 1. It is not necessary for first reactor 1 and second reactor 1A to be identically designed, although they may be.

An arrangement of reactors such as shown in FIG. 6 is well-suited for conducting 2-step ALD and/or MLD reactions, in which each reaction cycle consists of the sequential application of exactly two reagents (i.e., an A-B type of reaction in which X=2). The powder is exposed to one of the reagents in first reactor 1 and then to the second reagent in second reactor 1A. Further reaction cycles can be conducted either by cycling the powder back through the first and second reactors 1 and 1A as many times as necessary to provide the desired coating thickness, or by passing the powder through one or more additional pairs of similar reactors.

The embodiment shown in FIG. 6 can be extended to accommodate ALD or MLD processes that include any greater number of reagents in the reaction cycle (such as A-B-C, A-B-C-D, A-B-C-B reaction cycles, among many other types), by stacking the corresponding number of reactors.

Figure 7:
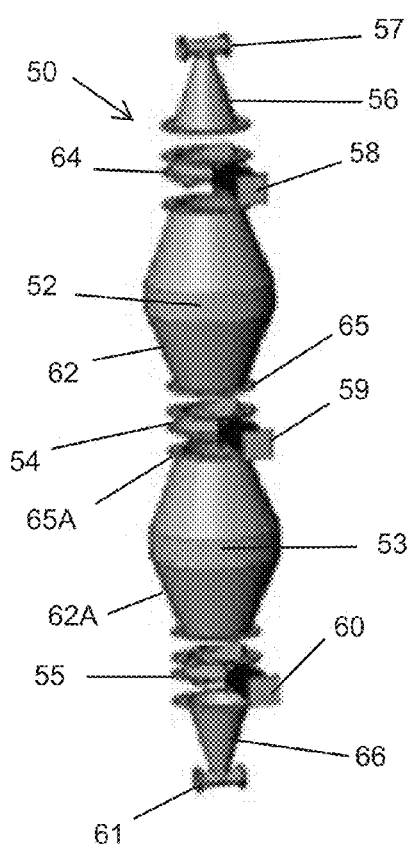
FIG. 7 is an exploded front view of another embodiment of a reactor of the invention.

Turning now to FIG. 7, there is shown an exploded view of another embodiment of the reactor of the invention. This embodiment includes an arrangement of simplified and modular constituent parts which can allow for inexpensive fabrication and assembly of commercial-scale reactors in accordance with the invention. Reactor 50 includes vessel 52, which functions as a powder reservoir, valve means 54, and vessel 53, which functions as the reactive precursor reservoir in this arrangement. Valve assembly 54 is flanged on top and bottom, for easy assembly into flanges 65 and 65A of vessels 52 and 53, respectively. It contains the valve means as described before, which separates the powder reservoir within vessel 52 from the reactive precursor reservoir within vessel 53, and functions in the same manner as already described. In addition, valve assembly 54 includes port 59, which, through appropriate design and valving, can perform one or more functions, such as (1) inlet for charging the reactive precursor(s) into vessel 53, (2) outlet through which a vacuum can be established within vessel 52, vessel 53, or both, (3) inlet for a purging gas, (4) outlet for a purging gas, (5) inlet for an additional fluidizing gas, and the like. Although a single port 59 is shown, multiple ports can be provided on valve assembly 54 as needed to perform the necessary or desired functions. In addition, monitoring equipment such as temperature and pressure sensors or other analytical devices can be mounted onto valve assembly 54.

As shown, valve assembly 54, when the valve means is in the open position, provides a constricted flow path through which the reactive precursor can flow from vessel 53 into vessel 52. Vessel 52 has a generally conical section 62, which is of diminishing cross-section in the direction of valve means 54, to facilitate the fluidization of the powder and its fall into vessel 53 when valve means 54 is opened.

As shown, lower valve assembly 55 is affixed to the bottom of vessel 53. Valve means 55 can be opened at the conclusion of the process to permit the coated powder to be removed from reactor 50. As shown, vessel 53 has a generally conical lower section 62A, which facilitates the flow of the powder out of the vessel when valve means 55 is opened. Conical lower section 62A is an optional feature. Another optional feature is port 60, which, depending on the specific design and valving may perform any one or more of the functions already described with respect to port 59. Multiple ports 60 may be provided.

In the embodiment shown, valve means 55 communicates with lower end unit 66, through which coated powder can be removed from vessel 53 at the end of the coating step. Conduit 61 represents an optional path through which the coated powder can be carried away.

As shown in FIG. 7, upper valve assembly 64 is affixed to the bottom of vessel 52. Upper valve assembly 64 provides a port through which starting powder can be charged into vessel 52, and through which vessel 52 can be sealed for conducting the coating operation. As shown, upper valve assembly 64 includes port 58, which again can through appropriate design and valving perform any one or more of the functions described with respect to port 59. As shown, upper valve assembly 54 communicates with upper end unit 56, though which starting powder can be introduced into vessel 52, such as through optional upper conduit 57.

A coating process can be performed within reactor 50 in a manner completely analogous to that described with respect to the embodiment in FIG. 1 or 3.

Figure 7A:
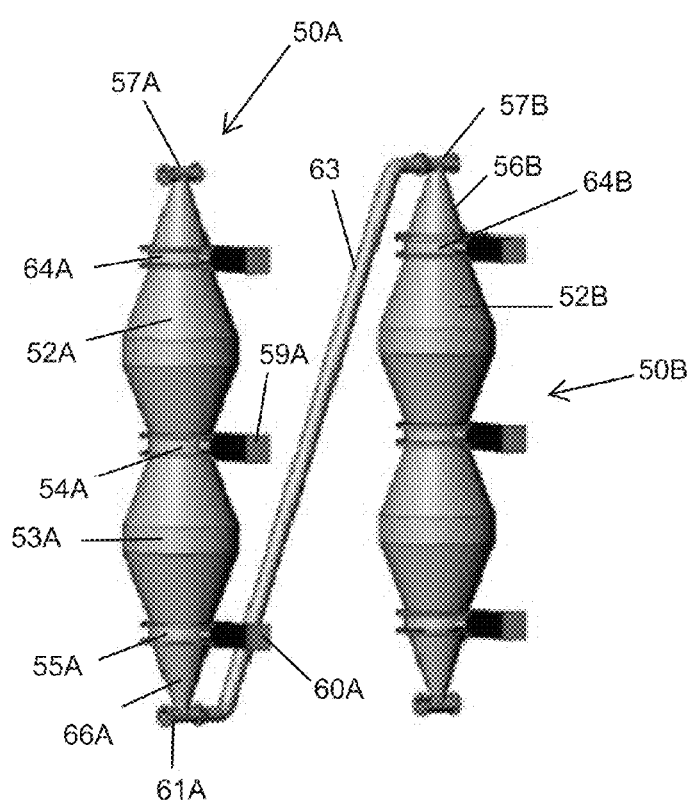
FIG. 7A is a front view of a reactor assembly of the invention.

FIG. 7A illustrates an assembly of two reactors, 50A and 50B of the type described in FIG. 7. In FIG. 7A, reactors 50A and 50B are connected via transport means 63, which can be of any of the types described before. Transport means 63 is in fluid communication with lower conduit 61A of reactor 50A and with upper conduit 57B of reactor 50B. Reactors 50A and 50B are adapted to sequentially expose a powder sample to two reactive precursors (or reactive precursor mixtures). Valve means 54A is placed into the closed position, and a starting powder is introduced into vessel 52A via upper conduct 57A and through upper valve means 64A, which is then closed. Lower valve means 55A is closed. Reactive precursor(s) are introduced into vessel 53A through ports 59A and/or 60A. Pressures are adjusted within vessels 52A and 53A such that the pressure within vessel 52A is less than that within vessel 53A, and the reactive precursor(s) within vessel 53A is in the vapor phase. Temperatures are brought to the necessary reaction temperature. Then valve means 54A is opened, allowing the reactive precursor vapor to enter vessel 52A, where it at least partially fluidized the powder and it or a reaction product thereof deposits on the surface of the powder particles. The powder particles fall into vessel 53A. By opening lower valve means 55A, the powder can fall into lower end unit 66A, into conduit 61A and be transported via transport means 63 to upper conduit 57B of reactor 50B, and from there into upper end unit 56B, through upper valve means 64B and into vessel 52B of reactor 50B. The powder can then be exposed to a second vapor phase reactant in reactor 50B, in a manner analogous to that just described.

As many reactors similar to reactor 50 can be joined in similar manner as needed to contact the powder with as many sequential applications of vapor phase reactant as is necessary to produce a coating of the desired type and thickness.

Reactor 50 also can be used to apply multiple dosings of reactive precursor(s) onto a powder sample. One way in which this can be done is to transport powder recovered from the reactive precursor reservoir in vessel 53 (FIG. 7) into the powder reservoir in vessel 52 and repeating the dosing process. Another way of performing multiple dosings is to invert the reactor, after the initial dosing is completed. In this approach, valve means 54 and valve means 55 are brought into a closed position, after the initial dosing step is completed and the powder has fallen into vessel 53. Reactor 50 can then be inverted, bringing vessel 53 into a position above vessel 52. Reactive precursor(s) can then be introduced into vessel 52 and the dosing procedure performed as before, with the particles falling into vessel 52 once valve means 54 is brought into the open position. By inverting reactor 50 after each dosing step, a powder can be sequentially exposed to any number of reactive precursors, all within the same reactor, to provide a coating of a desired thickness.

Because the individual reactors tend to be relatively small (compared to batch reactors which process similar throughputs of material per unit time), and preferably identical enough to leverage an economy of scale, they tend to be less expensive to construct and to operate. In addition, it is easier to control temperatures and pressures in the smaller reactors and, in particular, to establish nearly uniform temperature and pressure conditions within the reactor space as well as a more uniform distribution of the reactive precursor vapor throughout the reactor space. The smaller scale also makes the process of the invention easily scalable by adding more reactors.

Figure 4:
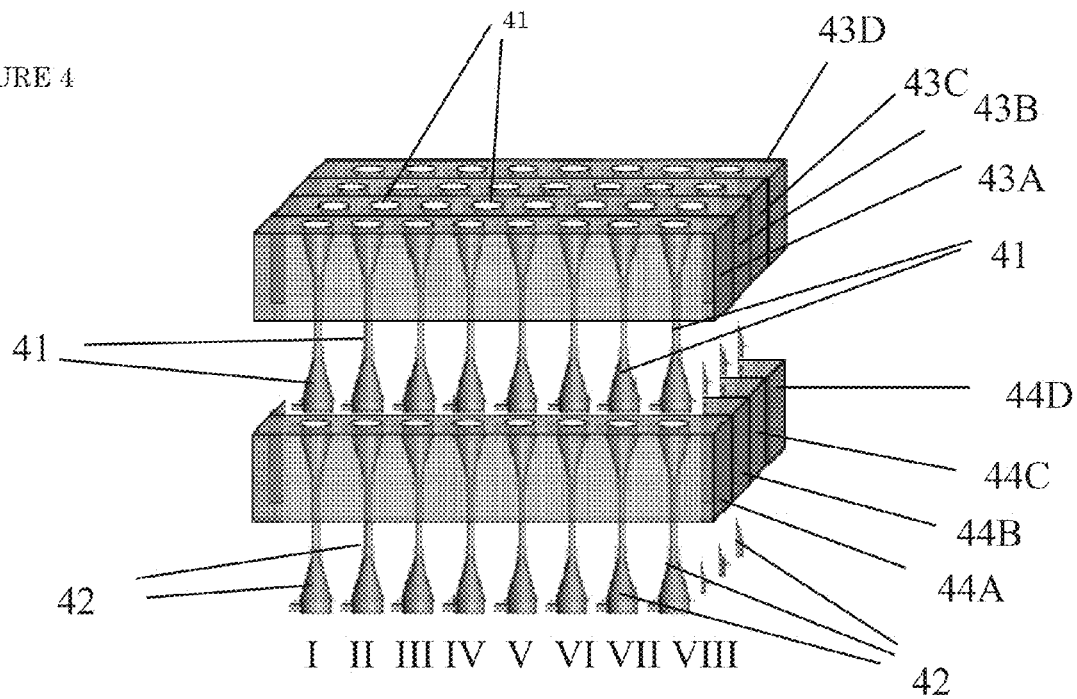
FIG. 4 is an embodiment of an array of reactors according to the invention with common heating elements.
Figure 5:
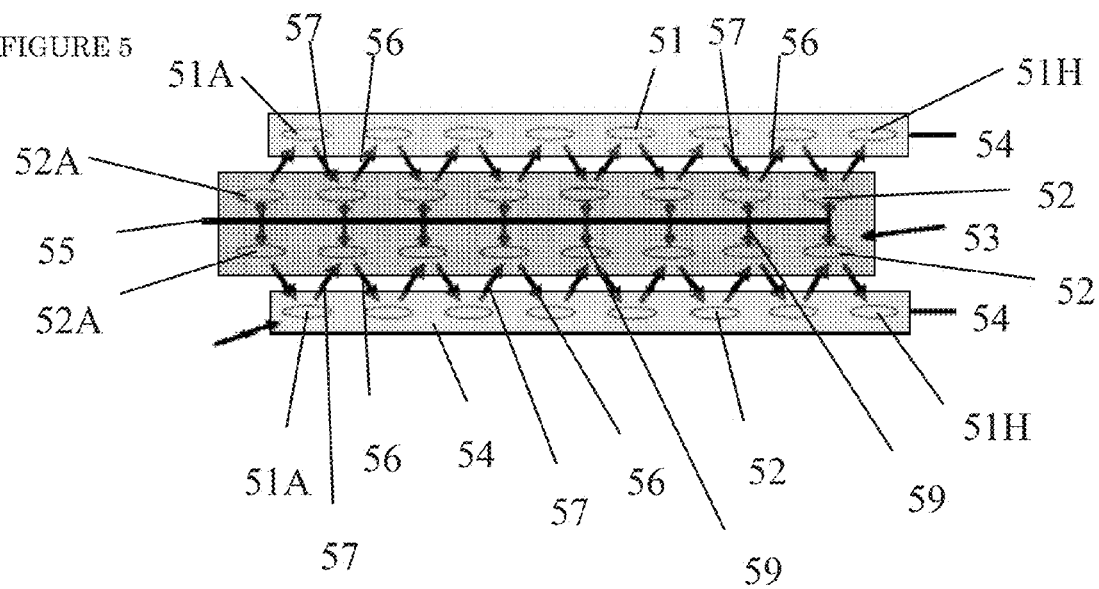
FIG. 5 is another embodiment of an array of reactors according to the invention with common heating elements.

FIGS. 4 and 5 illustrate approaches to scaling. In FIG. 4, reactors are arranged in sets of two. Each set includes one top reactor 41 and one bottom reactor 42, which are arranged with top reactor 41 above the corresponding bottom reactor 42. This arrangement allows powder discharged from the top reactor 41 of each set to drop directly into the powder reservoir of the corresponding bottom reactor 42. Top reactors 41 and bottom reactors 42 generally have the features as described before, with respect to the discussion of FIGS. 1, 3 and/or 6. A total of 28 reactor pairs are shown in FIG. 4 for purposes of illustration, although any number of sets of reactors can be used in any particular production facility. In FIG. 4, the reactor pairs are arranged in seven columns, indicated by Roman numerals I-VII, respectively, and four rows, indicated as A, B, C and D.

If a coating is to be applied to a starting powder in a two-step reaction sequence (an A-B sequence in which X=2) involving two reagents, then each of the reactor pairs can be used to perform one reaction cycle. If only a single reaction cycle is to be performed on the powder, then the powder needs to pass through only a single reactor pair one time in order to complete the coating operation. In that case, an arrangement of multiple sets of reactors such as that shown in FIG. 4 increases the capacity of the production facility, because coating operations can be conducted simultaneously in multiple reactor sets. In the embodiment shown, capacity can be increased as much as 28-fold, by conducting simultaneous coating operations simultaneously in each of the reactor pairs. Any arbitrary number of reactor pairs can be operated at any given time, to provide the production capacity that is required.

If the desired coating is to be thicker than what can be deposited in a single reaction cycle, then the powder can be subjected to multiple reaction cycles. This can be done by (1) passing the powder repeatedly through a single reactor set as many times as desired or (2) passing the powder sequentially through two or more sets of reactors. In that case, powder exiting any bottom reactor 42 can be introduced into the powder reservoir of a top reactor 41 of another reactor set for application of the next coating layer, via some transport means (not shown in FIG. 2). In FIG. 2, for example, a starting powder can be introduced into the powder reservoir of top reactor 41 of the reactor pair in column I and row A (pair I-A). After application of a coating layer in reactor pair I-A, the powder can be transferred to any other of the reactor pairs, such as, for example, pair II-A or pair I-B, for application of the next coating layer, and so on, until as many as 28 coating layers are applied. Additional batches of powder can be loaded into reactor pair I-A and coated at the same time that additional coating layers are applied to previously treated batches of powder, in one or more downstream reactor pairs. If fewer than 28 coating layers are to be applied, then different batches of powder can be coated simultaneously using different sub-sets of the reactor array.

When the ALD or MLD reaction cycle involves the sequential exposure to three or more reagents, each reactor set as shown in FIG. 4 can be modified if desired by stacking the corresponding number of reactors in each set.

The relatively small scale of the individual reactors can lead to other process efficiencies, notably in the area of heat transfer. Groups of reactors which perform the same coating operation, or operate at the same temperatures, often can be commonly heated and/or cooled. An example of this is shown in FIG. 2. In FIG. 2, heating blocks 43A, 43B, 43C and 43D provide common heating to at least the powder reservoir and reactive precursor reservoirs of top reactors 41 in rows A, B, C and D, respectively. This arrangement easily permits the powder and vapor phase reservoirs in the top reactors in any of rows A, B, C and D to be brought together to the same operating temperature, and can result in savings in both equipment and operating costs. Similarly, heating blocks 44A, 44B, 44C and 44D provide common heating to at least the powder reservoir and reactive precursor reservoirs of bottom reactors 42 in rows A, B, C and D, respectively. In the arrangement shown, heating blocks 43A, 43B, 43C and 43D can be operated as a single group, or individually, as can heating blocks 44A, 44B, 44C and 44D. Thus, for example, heating blocks 43A, 43B, 43C and 43D can all be operated at different temperatures as needed to apply the particular reactive precursor used in the coating step of the particular reactors 41. If only a portion of the reactors are in use at any particular time, the block arrangement shown in FIG. 2 easily permits heating or cooling to be turned off with regard to reactors that are not in use.

FIG. 5 illustrates another approach to scaling. In FIG. 5, reactors 52 are arranged in two rows, and reactors 51 also are arranged in two rows. As shown, the rows of reactors 51 are exterior to the rows of reactors 52. This arrangement is useful for applying coatings in a two-step (A-B type) reaction cycle, in which one of the reactive precursors is contacted with the powder in reactors 52 and the second reactive precursor is contacted with the powder in reactors 51. After the powder is contacted with the first reactive precursor in one of reactors 52, it is transferred to a reactor 51 for contact with the second reactive precursor. One potential pathway for the powder through the system is indicated by arrows 56 and 57. A starting powder can be charged to either or both reactors 52A, contacted with the first reactive precursor, and then transferred to reactor 51A in the direction indicated by arrow 56A for contact with the second reactive precursor and completion of the first reaction cycle. The powder can then be transferred to the next reactor 52 in the sequence, as indicated by the first arrow 57, and so on down the line of reactors to apply multiple (in the embodiment shown, up to eight) coating layers to the powder. As the configuration shown in FIG. 5 contains two rows each of reactors 51 and 52, it can be operated to conduct two coating operations in parallel. The configuration in FIG. 5 can be scaled as much as desired, by adding more rows of reactors, or by lengthening the rows. If a coating cycle includes contacting the powder with three or more vapor reagents, additional rows of reactors can be added to conduct those steps in the reaction cycle, too.

In FIG. 5, at least the powder and vapor phase reservoirs of each reactor 52 are contained within blocks 54, and at least the powder and vapor phase reservoirs of reactors 51 are contained within blocks 58. Blocks 54 and 58 can supply temperature control, i.e., heating and/or cooling, to reactors 52 and 51, within the respective blocks. Reactive precursor may be supplied to some or all of reactors 52 through a common feed system. This common feed system can be housed within block 54, or may be separate from block 54. In FIG. 5, this common feed system for the reactive precursor is represented by line 55 and double-headed arrows 59. Similarly, reactive precursor can be fed to some or all of reactors 51 through a common feed system (not shown).

An arrangement of reactors as shown in FIG. 5 is especially useful when the reactions that take place in reactors 51 and reactors 52, respectively, are conducted at different temperatures.

The reactor of the invention may include many additional components or features as may be necessary or helpful to perform the desired reactions. One or more inlet ports may be in fluid communication with external sources of the reactive precursor(s). Various types of valves, pumps and metering and/or sensing devices may be provided to ensure accurate dosing of the reactive precursors. One or more inlet ports may be in fluid communication with a source of a purge gas, or a sweep gas, again optionally in conjunction with various types of valves, pumps, metering and/or sensing devices. Outlet ports may be in fluid communications with various valves, vacuum pumps, metering devices and/or sensing devices. Various sensors and gauges or other measuring devices may be present, as necessary or desirable. Analytical devices may be present to detect the presence and/or concentration of reactive precursors, purge gases and/or various reaction products, and to measure the presence and/or extent of coatings on the particle surfaces. Heating and/or cooling devices may be present to provide temperature control to the powder reservoir, the reactive precursor reservoir, or both. Computerized control and operating devices may be used to operate one or more valves, pumps, heating and/or cooling devices, or other devices. A porous knife valve or similar device may be present between the powder reservoir and the reactive precursor reservoir. When closed, this porous knife value or similar device can act as a support for the powder bed, and permit the reactor to function as a conventional fluidized bed reactor.

Apparatus in accordance with the invention is suitable for conducting vapor deposition techniques on powder substrates. Preferred processes are atomic layer deposition (ALD) and molecular layer deposition (MLD). ALD processes are especially suitable for applying a variety of inorganic coatings to a substrate, including, for example, oxide coatings such as aluminum oxide, silicon oxide, zinc oxide, zirconium oxide, titanium oxide, boron oxide, yttria, zinc oxide, magnesium oxide, and the like; nitride coatings such as silicon nitride, boron nitride and aluminum nitride; sulfide coatings such as gallium sulfide, tungsten sulfide and molybdenum sulfide, as well as inorganic phosphides. In addition, various metal coatings can be applied using ALD methods, including cobalt, palladium, platinum, zinc, rhenium, molybdenum, antimony, selenium, thallium, chromium, platinum, ruthenium, iridium, germanium and tungsten.

Exemplary ALD processes for depositing nanocoatings are described in U.S. Pat. Nos. 6,613,383, 6,713,177, U.S. Published Patent Application No. 2004/0224087 and WO 03/008186A1. In the ALD process, the coating-forming reaction is conducted as a series of two or more (typically two) half-reactions. In each of these half-reactions, a single reagent is introduced into contact with the substrate surface. Conditions are such that the reagent is in the form of a gas. The reagent deposits on the surface of the substrate. In most cases it reacts with functional groups on the surface of the substrate and becomes bound to the substrate. Because the reagent is a gas, it permeates into pores in the substrate and deposits onto the interior surfaces of the pores as well as onto the exterior surfaces of the substrate. Excess amounts of the reagent are then removed, which helps to prevent the growth of undesired, larger inclusions of the coating material. Each remaining half-reaction is then conducted in turn, each time introducing a single reagent, allowing it to react at the surface of the particle, and removing excess reactant before introducing the next reagent. A carrier gas may be used to introduce the reagents, and the powder may be swept with the carrier gas to help remove excess reagents and gaseous reaction products.

The process of the invention is useful for producing composite combustion particles and nanoparticles of the type described in U.S. Pat. No. 7,635,461. In such particles and nanoparticles, a metal core particle is first coated with a metal oxide layer, and is then coated with a catalyst layer directly onto the metal oxide layer. In the inventive process, the starting metal particles are fed into a first chamber, and the desired coating process is carried out in consecutive chambers with conveying steps between chambers. As particles move from chamber 'n' to chamber 'n+1', the particles from chamber 'n−1' can be conveyed into chamber 'n'. The vapor deposition process that occurs, and conditions for said process, may vary from chamber to chamber, in that the metal oxide layer is first deposited across some subset of chambers, and the catalyst layer is deposited subsequently on a subsequent subset of chambers. A bag loading, or similar unit operation, or post-processing step may occur after the powder exits the last processing chamber.

The process of the invention is also useful for producing core shell catalyst particles with high specific mass activity, of the type describe in U.S. Patent Application No. 2010/0092841 or for producing size-selected metal nanoclusters as described in U.S. Pat. No. 7,713,907.

The process of the invention can be used to perform plasma-based processes such as described in U.S. Pat. No. 7,758,928 and U.S. Pat. No. 6,428,861, in which particles are functionalized. A benefit of such plasma-based processes in some cases is to reduce the operating temperature of a deposition process. A plasma process in as described in these two patents can be performed in some or all of the individual chambers in which a process of the present invention is performed.

The process of the invention can be used to produce high volumes of products, such as, for example, titanium dioxide-coated particles as described in U.S. Patent Application No. 2010/0326322 or coated lithium metal oxide particles for use as high performance cathodes in lithium ion batteries, as described in U.S. Patent Application No. 2009/0155590. A benefit of this semi-continuous or semi-batch invention over conventional batch fluidized bed reactors is that high annual throughputs can be achieved using reasonably sized equipment and therefore reasonable capital costs. In addition, the rate-limiting step of batch vapor phase deposition processes in fluidized bed reactors is the rate at which the vapor can enter the reactor without elutriating the particles. The present invention makes the particle transport through the semi-continuous process the rate-limiting step as vapor phase reactants are pre-loaded into chambers below a valve.

The present invention can also be used directly in line after a titanium dioxide production process, for example as described in U.S. Pat. No. 7,476,378, to produce particles coated with titanium dioxide. The lithium oxide particles may be made, for example, via a flame spray process described in U.S. Pat. No. 7,211,236 or a plasma spray process as described in U.S. Pat. No. 7,081,267, or similar processes; and the coating process of this invention can be performed directly in-line after such lithium oxide particles are produced. More generally, particles to be coated in accordance with the invention can be of any type produced using known particle manufacturing processes. The coating process of this invention can be performed as part of an integrated manufacturing process which includes a manufacturing step to produce the particle followed directly or indirectly by the coating process of the invention. Another example of such a particle manufacturing process which can be integrated with the coating process of this invention is a process for producing ultrafine metal particles such as is described in U.S. Pat. No. 6,689,191. Air- and moisture-sensitive powdered materials can be safely transported from the production step in-line to the semi-continuous coating step in accordance with the present invention. The process of this invention can be integrated into a manufacturing process for producing moisture-resistant phosphors, such as, for example, the ZnS phosphor particle manufacturing process described in U.S. Pat. No. 7,833,437. Using the process of this invention, a first subset of chambers can be used to dope rare earth elements onto or into the ZnS carrier particles to make them phosphorescent, unless that was already performed in the particle production process. A subsequent subset of chambers can be employed to perform atomic layer deposition cycles for the desired number of chambers (equaling two times the desired number of ALD cycles), or can alternate between ALD and CVD along the chain of reactors, and produce higher precision ALD/CVD multilayers in a semi-continuous fashion.

Any of the particles made in such a preliminary particle-manufacturing step can be directly produced in a particle production process using an convenient continuous flow process, can be delivered into a weigh batching system with a metering valve (rotary airlock or similar), and can then enter into the process described in the present invention.

Molecular layer deposition processes are conducted in a similar manner, and are useful to apply organic or inorganic-organic hybrid coatings. Examples of molecular layer deposition methods are described, for example, in WO08/069894.

Atomic layer and molecular layer deposition techniques permit the deposition of coatings of about 0.1 to 5 angstroms in thickness per reaction cycle, and thus provide a means of extremely fine control over coating thickness. Thicker coatings can be prepared by repeating the reaction sequence to sequentially deposit additional layers of the coating material until the desired coating thickness is achieved.

Reaction conditions in vapor phase deposition processes such as ALD and MLD are selected mainly to meet three criteria. The first criterion is that the reagents are gaseous under the conditions of the reaction. Therefore, temperature and pressure conditions are selected such that the reactants are volatilized when the reactive precursor is brought into contact with the powder in each reaction step. The second criterion is one of reactivity. Conditions, particularly temperature, are selected such that the desired reaction between the reactive precursor and the particle surface occurs at a commercially reasonable rate. The third criterion is that the substrate is thermally stable, from a chemical standpoint and from a physical standpoint. The substrate should not degrade or react at the process temperature, other than a possible reaction on surface functional groups with one of the reactive precursors at the early stages of the process. Similarly, the substrate should not melt or soften at the process temperature, so that the physical geometry, especially pore structure, of the substrate is maintained. The reactions are generally performed at temperatures from about 270 to 1000 K, preferably from 290 to 450 K.

Between successive dosings of the reactive precursors, the particles can be subjected to conditions sufficient to remove reaction products and unreacted reagents. This can be done, for example, by subjecting the particles to a high vacuum, such as about $10^{-5}$ Torr or greater, after each reaction step. Another method of accomplishing this, which is more readily applicable for industrial application, is to sweep the particles with an inert purge gas between the reaction steps. This sweep with inert gas can be performed while the particles are being transported from one reactor to the next, within the apparatus. Dense- and dilute-phase techniques, either under vacuum or not, are known to be suitable for the pneumatic conveying of a wide variety of industrially relevant particles that would be well-served by the functionalization process described herein.

In CVD processes, two or more reactive precursors are simultaneously brought into contact with the powder particles. The reactive precursors typically react in the gas phase to form a reaction product that deposits onto the particle surfaces to form the coating. The precursors in this case can all be introduced into the reactive precursor reservoir, and brought together into the powder reservoir. Alternatively, it is possible to introduce one of the reactive precursors into the powder reservoir in the form of a vapor, together with the powder. The second reactive precursor is introduced into the reactive precursor reservoir as described above, at a higher pressure than that established within the powder reservoir. The valve means separating the reservoirs is opened as before, allowing the second reactive precursor to escape into the powder reservoir, at least partially fluidizing the particle, and reacting with the first reactive precursor to form a reacting product which deposition on the powder particles and forms a coating thereon.

The starting powder can be any material which is chemically and thermally stable under the conditions of the deposition reaction. By "chemically" stable, it is meant that the powder particles do not undergo any undesirable chemical reaction during the deposition process, other than in some cases bonding to the applied coating. By "thermally" stable, it is meant that the powder does not melt, sublime, volatilize, degrade or otherwise change its physical state under the conditions of the deposition reaction. Inorganic powders are a preferred substrate. These include silica, alumina, glass, metals, phosphors, silicon, iron oxide, other metal oxides, nitrides such as tungsten nitride or boron nitride, and a wide range of other materials. Organic materials, including powdered organic polymers, can be coated as well in some cases, when deposition temperatures are somewhat low. The powder may have a particle size of as little as 5 nanometers, up to micron size or greater. A preferred particle size is up to 100 microns, and a more preferred particle size is up to 1 micron. An especially preferred particle size is up to 100 nm.

The applied coating may be as thin as about 1 angstrom (corresponding to about one ALD cycle), and as thick as 100 nm or more. A preferred thickness range is from 2 angstroms to about 25 nm.

The following examples are provided to illustrate coating processes applicable to making the particles of the invention. These examples are not intended to limit the scope of the inventions. All parts and percentages are by weight unless otherwise indicated.

EXAMPLE 1

80.0 g of 250 nm $TiO_2$ particles is put into the powder reservoir of a reactor as shown in FIG. 3. The reactive precursor reservoir 33 is 1.5" (3.8 cm) in diameter; the diameters of powder reservoir 32 and purge zone 36 each flares out to 3" (7.6 cm). Prior to sealing the reactor, the ball valves are opened and all of the powder falls through to the bottom section. This demonstrates that the reactor dimensions are large enough to prohibit powder from necking during sealed operation. The volumes of powder reservoir 32 and purge zone 36 are each about twice that of reactive precursor reservoir 33.

The reactor is sealed and pumped down to a vacuum level of about 200 mTorr using a rotary vane vacuum pump. Heating tapes are used to heat the reactor and its contents to ~77° C. Trimethylaluminum (TMA), preheated to 90° C., is introduced into reactive precursor reservoir 33 until the pressure is approximately 75 Torr. Ball valve 34 is opened and the pressures in powder reservoir 32 and reactive precursor reservoir 33 equilibrate almost instantly, fluidizing the powder and infiltrating the TMA into the falling powder mass.

The powder is allowed to settle in the reactive precursor reservoir for about one minute, after which ball valve 34 is closed and the powder reservoir is purged. A vacuum port is also opened in reactive precursor reservoir 33 to remove unreacted precursor and methane, which is a byproduct of this reaction. The pressure in reactive precursor reservoir 33 remains below 5 Torr. $N_2$ is administered into purge zone 36 until a pressure of 15 Torr is reached in that zone. Ball valve 35 is then opened, and the pressure equilibrates between purge zone 36 and reactive precursor reservoir 33, fluidizing the powder as it falls into purge zone 36. Vacuum is opened in the purge zone, and after a short amount of time, ball valve 35 is closed. The purge is continued for all sections of the reactor for approximately 5 minutes to remove the residual methane from the system.

The powder is then charged again into powder reservoir 32 and a vacuum pulled as before. Room temperature water is administered to reactive precursor reservoir 33 using a 10 s pulse, resulting in a pressure of ~25 Torr in reactive precursor reservoir 33. Upon opening ball valve 34, the water vapor flows into powder reservoir 32, fluidizing the powder and contacting the vapor with the particle surfaces. The pressure in the combined volumes of powder reservoir 32 and reactive precursor reservoir 33 is approximately 8 Torr, which provides more than enough water exposure to adequately saturate the entire surface area. The reactive precursor reservoir is purged, purge zone 3 is pressurized, the particles are conveyed into purge zone 35, and the entire system purged as before. This completes one cycle of the 2-step ALD reaction to produce an aluminum oxide coating.

Four more cycles are conducted on the same powder sample, in the same manner except that the amount of TMA is reduced. ICP elemental spectroscopy indicates that the coating constitutes 0.3% by weight of the finished particles, which corresponds to an $Al_2O_3$ film thickness of 0.25 nm, or 0.05 nm/cycle. This was slightly lower than expected, and indicates that reactants are under-dosed in this experiment.

The entire process takes about one hour, or about 6 minutes per reaction cycle, which is much shorter than cycle times in conventional batch reactors. As a result, significantly higher reactor throughputs can be obtained with this reactor design.

EXAMPLE 2

Example 1 is repeated, this time using 50.0 g of high surface area $TiO_2$ nanoparticles (79 m$^2$/g) as the starting powder. The precursors (TMA and $H_2O$) are individually preheated to temperatures such that their respective vapor pressures equal approximately 30 Torr. The dosing times are 2 seconds for each precursor. At the onset of the dose time, the pressure immediately shoots up to approximately 25 Torr, and rise to 30-35 Torr over the dosing period. The amount of precursor administered to the system in each dose is slightly sub-stoichiometric. The sequential dosing and purging of the TMA and $H_2O$ are repeated for five cycles. The powder is removed and analyzed for $Al_2O_3$ using ICP-AES. The ALD growth rate is 0.5 Å/cycle, again indicated that the reactants are somewhat underdosed.

EXAMPLE 3

The reactor of FIG. 3 is modified to accommodate a three-zone dosing section for each precursor, whereby one-third of the reactive precursor is applied to the powder in each of the three zones. The three zones are arranged one above the other, and each are separated by a ball valve such a valve 34. This proceeded identically to that described in Example 2, except that both the TMA and the water are introduced to the powder over the three zones in three equivalently timed sub-dose regimes. This process is continued for 5 cycles, and the resulting growth rate is double the rate obtained in Example 2.

EXAMPLE 4

10.0 g of high surface area $TiO_2$ nanoparticles (79 m$^2$/g) are loaded into the reactor as described in Example 1. Diethylzinc and water are used as precursors to deposit ZnO films using ALD techniques. The reactor configuration is heated to ~80° C. The process is performed for 10 cycles, whereby diethylzinc and water are sequentially dosed onto the powder in the manner described in Example 1. The resulting ZnO ALD growth rate is ~0.8 Å/cycle.

EXAMPLE 5

20.0 g of high surface area $ZrO_2$ nanoparticles (46 m$^2$/g) are loaded into the reactor described in Example 1. Titanium tetraisopropoxide (TTIP) and hydrogen peroxide ($H_2O_2$) are used as precursors to deposit $TiO_2$ films using ALD techniques. The reactor configuration is heated to ~80° C. The process is performed for 20 cycles, whereby TTIP and $H_2O_2$ are sequentially dosed onto the powder in the manner described in Example 2. The resulting $TiO_2$ ALD growth rate is ~0.4 Å/cycle.

EXAMPLE 6

20.0 g of high surface area $ZrO_2$ nanoparticles (46 m$^2$/g) are loaded into the reactor described in Example 1. Titanium tetrachloride ($TiCl_4$) and hydrogen peroxide ($H_2O_2$) are used as precursors to deposit $TiO_2$ films using ALD techniques. The reactor configuration is heated to ~80° C. The process is performed for 20 cycles, whereby TTIP and $H_2O_2$ are sequentially dosed onto the particles in the general manner described in Example 1. The resulting $TiO_2$ ALD growth rate is ~0.6 Å/cycle.

EXAMPLE 7

100.0 g of pigment-grade $TiO_2$ nanoparticles (7 m$^2$/g) are loaded into the reactor described in Example 1. Silicon tetrachloride ($SiCl_4$) and water are used as precursors to deposit $SiO_2$ films using $NH_3$-catalyzed ALD techniques at room temperature. The $NH_3$ is administered into the otherwise sealed powder reservoir to allow for the physisorption of the catalyzing material to occur on all particle surfaces. After adequate physisorption time, the typical ALD half-reaction dose, hold and purge ensue in the general manner described in Example 1. The $NH_3$ administration is repeated prior to each ALD half-reaction. The process is performed for 10 cycles, whereby $SiCl_4$ and $H_2O$ are used to deposit $SiO_2$ ALD films on particle surfaces using a low temperature (23° C.) catalyzed ALD process. The resulting $SiO_2$ ALD growth rate is ~0.5 Å/cycle.

What is claimed is:

1. A reactor configured for performing a single two-reagent atomic layer or molecular layer vapor phase deposition cycle on a powder, comprising:
   a powder reservoir;
   a first reactive precursor reservoir positioned below said powder reservoir;
   a second reactive precursor reservoir positioned below said first reactive precursor reservoir;
   a reactive precursor dosing system;
   a first constricted flow path flanged valve assembly operatively interposed between said powder reservoir and said first reactive precursor reservoir comprising a first valve, at least one valved inlet port in fluid communication with said first reactive precursor reservoir and said reactive precursor dosing system, at least one valved outlet port in fluid communication with said powder reservoir, said first reactive precursor reservoir or both, wherein said valved outlet port is in fluid communication with a vacuum pump for removing fluids from said powder reservoir and/or said first reactive precursor reservoir and/or producing a vacuum therein, wherein said first valve operable between an open and a closed position such that said powder reservoir is isolated from said first reactive precursor reservoir when said first valve is in the closed position but when said first valve is in the open position said first flanged valve assembly is computer controlled and is configured to allow simultaneous transfer of a powder contained within said powder reservoir into said first reactive precursor reservoir and a first reactive precursor contained within said first reactive precursor reservoir into said powder reservoir while allowing instant contact between the powder and the first reactive precursor to produce a first coated powder;
   a second constricted flow path flanged valve assembly operatively interposed between said first reactive precursor reservoir and said second reactive precursor reservoir comprising a second valve, at least one valved inlet port in fluid communication with said second reactive precursor reservoir and said reactive precursor dosing system, at least one valved outlet port in fluid communication with said first reactive precursor reservoir, said second reactive precursor reservoir or both, wherein said valved outlet port is in fluid communication with a vacuum pump for removing fluids from said first reactive precursor reservoir and/or said second reactive precursor reservoir and/or producing a vacuum therein, wherein said second valve operable between an open and a closed position such that said first reactive precursor reservoir is isolated from said second reactive precursor reservoir when said second valve is in the closed position but when the said second valve is in the open position, said second flanged valve assembly is computer controlled and is configured to allow simultaneous transfer of a powder contained within said first reactive precursor reservoir into said second reactive precursor reservoir and a second reactive precursor contained within said second reactive precursor reservoir into said first reactive precursor reservoir while allowing instant contact between the powder and a second reactive precursor to produce a second coated powder, wherein the powder reservoir comprises a conical section having gradually diminished cross-sections toward said first constricted flow path flanged valve assembly, wherein the first reactive precursor reservoir comprises a conical section having gradually diminished cross-sections toward said second constricted flow path flanged valve assembly, and wherein the reactor is configured to perform said atomic layer or molecular layer deposition cycle to deposit a coating of about 5 Angstroms or less on said powder having a particle size of 100 microns or less.

2. The reactor of claim 1, further comprising at least one of (a) a powder inlet for charging powder to the powder reservoir; (b) at least one analytical device for detecting the presence and/or concentration of at least one reactive precursor, sweep gas, purge gases and/or reaction product, and/or to measure the presence and/or extent of coatings on the particle surfaces and (c) at least one heating and/or cooling device to provide temperature control to the powder reservoir, the reactive precursor reservoir, or both.

3. The reactor of claim 1 further comprising a first coated powder reservoir located between said first reactive precursor reservoir positioned below said second constricted flow path flanged valve assembly, and an additional constricted flow path flanged valve assembly operatively interposed between said first coated powder reservoir and said second reactive precursor reservoir, said additional constricted flow path flanged valve assembly comprising an additional valve and at least one valved outlet port in fluid communication with said vacuum pump, wherein said first coated powder reservoir is configured to receive said first coated powder from said first reactive precursor reservoir and to remove said first reactive precursor from said first coated powder, and wherein the first coated powder reservoir comprises a conical section having gradually diminished cross-sections toward said additional constricted flow path flanged valve assembly.

4. The reactor of claim 1 further comprising a dense-phase pneumatic conveyor operatively interposed between said second reactive precursor reservoir and a powder inlet for charging powder to said powder reservoir to conduct further atomic layer or molecular layer deposition reaction cycles on said powder having a particle size of 100 microns or less to deposit a coating of 100 nm or less.

5. The reactor of claim 1 configured for a single complex three-reagent or optionally a four-reagent atomic layer or molecular layer vapor phase deposition cycle on a powder further comprising:

a third reactive precursor reservoir positioned below said second reactive precursor reservoir;

a third constricted flow path flanged valve assembly operatively interposed between said second reactive precursor reservoir and said third reactive precursor reservoir comprising a third valve, at least one valved inlet port in fluid communication with said third reactive precursor reservoir and said reactive precursor dosing system, at least one valved outlet port in fluid communication with said second reactive precursor reservoir, said third reactive precursor reservoir or both, wherein said valved outlet port is in fluid communication with a vacuum pump for removing fluids from said second reactive precursor reservoir and/or said third reactive precursor reservoir and/or producing a vacuum therein, wherein said third valve is interposed between said second reactive precursor reservoir and said third reactive precursor reservoir, said third valve operable between an open and a closed position such that said second reactive precursor reservoir is isolated from said third reactive precursor reservoir when said third valve is in the closed position but when said first valve is in the open position, said third flanged valve assembly is computer controlled and is configured to allow simultaneous transfer of a powder contained within said second reactive precursor reservoir into said third reactive precursor reservoir and a third reactive precursor contained within said third reactive precursor reservoir into said second reactive precursor reservoir while allowing instant contact between the powder and the third reactive precursor to produce a third coated powder;

optionally, a fourth reactive precursor reservoir positioned below said third reactive precursor reservoir with a fourth constricted flow path flanged valve assembly operatively interposed between said third reactive precursor reservoir and said fourth reactive precursor reservoir comprising a fourth valve, at least one valved inlet port in fluid communication with said fourth reactive precursor reservoir and said reactive precursor dosing system, at least one valved outlet port in fluid communication with said third reactive precursor reservoir, said fourth reactive precursor reservoir or both, wherein said valved outlet port is in fluid communication with a vacuum pump for removing fluids from said third reactive precursor reservoir and/or said fourth reactive precursor reservoir and/or producing a vacuum therein, wherein said fourth valve is interposed between said third reactive precursor reservoir and said fourth reactive precursor reservoir, said fourth valve operable between an open and a closed position such that said third reactive precursor reservoir is isolated from said fourth reactive precursor reservoir when said fourth valve is in the closed position but when said fourth valve is in the open position, said fourth flanged valve assembly is computer controlled and is configured to allow simultaneous transfer of a powder contained within said third reactive precursor reservoir into said fourth reactive precursor reservoir and a fourth reactive precursor contained within said fourth reactive precursor reservoir into said third reactive precursor reservoir while allowing instant contact between the powder and the fourth reactive precursor to produce a fourth coated powder;

wherein the third reactive precursor reservoir comprises a conical section having gradually diminished cross-sections toward said third constricted flow path flanged valve assembly, wherein the optional fourth reactive precursor reservoir comprises a conical section having gradually diminished cross-sections toward said optional fourth constricted flow path flanged valve assembly, and wherein the reactor is configured for performing said complex atomic layer or molecular layer deposition cycle to deposit a coating of about 5 Angstroms or less on said powder having a particle size of 100 microns or less.

6. A semi-continuous reactor assembly configured to carry out a sequence of N two-reagent atomic layer or molecular layer vapor phase deposition cycles on a powder, for up to N=200 to deposit a coating of about 100 nm or less on said powder having a particle size of 100 microns or less, comprising:
- a first Reactor of claim 1;
- a second Reactor of claim 1;
- a first gravitational or dense-phase pneumatic conveyor operatively interposed between said first Reactor of claim 1 and second Reactor of claim 1 for charging powder into said second reactor of claim 1;
- a third through Nth Reactor of claim 1;
- a second through (N−1)th gravitational or dense-phase pneumatic conveyor operatively interposed between the nth Reactor of claim 1 and the (n+1)th Reactor of claim 1, where $2 \leq n \leq (N-1)$;
- wherein a first reactive precursor is supplied to the first reactive precursor reservoirs of some or all of the N Reactors of claim 1 through a common feed system, wherein a second reactive precursor is supplied to the second reactive precursor reservoirs of some or all of the N Reactors of claim 1 through a common feed system, and wherein all N Reactors of claim 1 are configured for simultaneous coating operations.

7. A semi-continuous reactor assembly configured to carry out a sequence of N three-reagent or optionally four-reagent atomic layer or molecular layer vapor phase deposition cycles on a powder, for up to N=200 to deposit a coating of about 100 nm or less on said powder having a particle size of 100 microns or less, comprising:
- a first Reactor of claim 5;
- a second Reactor of claim 5;
- a first gravitational or dense-phase pneumatic conveyor operatively interposed between said first Reactor of claim 5 and second Reactor of claim 5 for charging powder into said second reactor of claim 5;
- a third through Nth Reactor of claim 5;
- a second through (N−1)th gravitational or dense-phase pneumatic conveyor operatively interposed between the nth Reactor of claim 5 and the (n+1)th Reactor of claim 5, where $2 \leq n \leq (N-1)$;
- wherein a first reactive precursor is supplied to the first reactive precursor reservoirs of some or all of the N Reactors of claim 5 through a common feed system, wherein a second reactive precursor is supplied to the second reactive precursor reservoirs of some or all of the N Reactors of claim 5 through a common feed system, wherein a third reactive precursor is supplied to the third reactive precursor reservoirs of some or all of the N Reactors of claim 5 through a common feed system, optionally wherein a fourth reactive precursor is supplied to the fourth reactive precursor reservoirs of some or all of the N Reactors of claim 5 through a common feed system, and wherein all N Reactors of claim 5 are configured for simultaneous operation.

\* \* \* \* \*